(12) United States Patent
Funakoshi

(10) Patent No.: US 9,851,087 B2
(45) Date of Patent: Dec. 26, 2017

(54) LIGHT EMITTING DEVICE AND LIGHTING APPARATUS

(71) Applicant: PANASONIC INTELLECTUAL PROPERTY MANAGEMENT CO., LTD., Osaka (JP)

(72) Inventor: Masashi Funakoshi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 19 days.

(21) Appl. No.: 15/055,963

(22) Filed: Feb. 29, 2016

(65) Prior Publication Data
US 2016/0265758 A1 Sep. 15, 2016

(30) Foreign Application Priority Data
Mar. 11, 2015 (JP) .................. 2015-048886

(51) Int. Cl.
| | |
|---|---|
| *B60Q 1/06* | (2006.01) |
| *F21V 29/70* | (2015.01) |
| *H01L 25/075* | (2006.01) |
| *H05K 1/02* | (2006.01) |
| *F21Y 105/16* | (2016.01) |
| *F21Y 115/10* | (2016.01) |
| *F21Y 103/33* | (2016.01) |
| *H05K 1/03* | (2006.01) |

(52) U.S. Cl.
CPC ............ *F21V 29/70* (2015.01); *H01L 25/075* (2013.01); *H05K 1/0209* (2013.01); *F21Y 2103/33* (2016.08); *F21Y 2105/16* (2016.08); *F21Y 2115/10* (2016.08); *H05K 1/0306* (2013.01); *H05K 2201/10106* (2013.01); *H05K 2203/0545* (2013.01)

(58) Field of Classification Search
CPC .. F21V 29/70; F21Y 2103/33; F21Y 2105/16; F21Y 2115/10; H01L 25/075; H05K 1/0209; H05K 1/0306; H05K 2201/10106; H05K 2203/0545
USPC .................................................. 362/218, 373
See application file for complete search history.

(56) References Cited

U.S. PATENT DOCUMENTS

| | | | | |
|---|---|---|---|---|
| 6,999,318 | B2 * | 2/2006 | Newby ..................... | F21K 9/00 257/706 |
| 7,736,016 | B2 * | 6/2010 | Suehiro .................... | F21K 9/00 362/218 |
| 7,740,373 | B2 * | 6/2010 | Yoon ........................ | F21K 9/00 257/98 |
| 8,445,926 | B2 | 5/2013 | Park et al. | |

(Continued)

FOREIGN PATENT DOCUMENTS

| | | | | |
|---|---|---|---|---|
| JP | 2001-15635 | | 1/2001 | |
| JP | 2003092011 | A * | 3/2003 | ............ F21V 29/004 |

(Continued)

*Primary Examiner* — Seung Lee
(74) *Attorney, Agent, or Firm* — Greenblum & Bernstein, P.L.C.

(57) ABSTRACT

A light emitting device includes: a substrate; one or more LED (light emitting diode) elements mounted on a substrate; and a radiator unit made of metal paste and arranged on a rear surface opposite to a principal surface on which the one or more LED elements are mounted. The height Ta of the radiator unit from a rear surface is less than thickness Tb of substrate.

7 Claims, 6 Drawing Sheets

(56) References Cited

U.S. PATENT DOCUMENTS

| | | | |
|---|---|---|---|
| 9,196,584 B2 | 11/2015 | Ogata et al. | |
| 9,252,337 B1* | 2/2016 | Cumpston | H01L 33/20 |
| 2008/0191231 A1 | 8/2008 | Park et al. | |
| 2015/0138772 A1* | 5/2015 | Hanslip | F21V 21/005 |
| | | | 362/249.06 |
| 2015/0155459 A1* | 6/2015 | Ishihara | H01L 25/0753 |
| | | | 362/294 |

FOREIGN PATENT DOCUMENTS

| | | |
|---|---|---|
| JP | 2006-147744 | 6/2006 |
| JP | 2007-194525 | 8/2007 |
| JP | 2007-227728 | 9/2007 |
| JP | 2009-21384 | 1/2009 |
| JP | 2009-21385 | 1/2009 |
| JP | 2009-522804 | 6/2009 |
| JP | 2014-116411 | 6/2014 |
| WO | 2007/078103 | 7/2007 |

\* cited by examiner

LIGHT EMITTING DEVICE AND LIGHTING APPARATUS

CROSS REFERENCE TO RELATED APPLICATION

This application claims the benefit of priority of Japanese Patent Application Number 2015-048886 filed on Mar. 11, 2015, the entire content of which is hereby incorporated by reference.

TECHNICAL FIELD

The present disclosure relates to a light emitting device and a lighting apparatus having the light emitting device.

BACKGROUND ART

Semiconductor light emitting elements such as LED (light emitting diode) elements etc. are widely used as highly-efficient space-saving light sources for lighting use or for use in various kinds of lighting apparatuses for display use etc.

An LED has a property of self-generating heat by emission of light, which increases the temperature of the LED and reduces output of light. Stated differently, light emission efficiency of the LED is reduced due to the self-generated heat. For this reason, it is important to take countermeasures against heat discharge of LED modules (light emitting devices).

Patent Literature 1 (Japanese Unexamined Patent Application Publication No. 2006-147744) discloses a light source device capable of discharging heat efficiently by way of a configuration in which a through hole is formed in a substrate and a heat sink which is a heat conductive member and an LED package which is a light emitting element are directly and closely in contact with each other.

SUMMARY OF INVENTION

An LED module has, for example, a substrate and one or more LED elements mounted on the substrate. The arrangement positions (layout) of the one or more LED elements on the substrate are required to be a layout suitable for, for example, use as an LED module. Furthermore, increase in a bundle of light and reduction in the size of the LED module are also required. Accordingly, there are demands for increasing efficiency of heat discharge by LED modules while satisfying the requirements.

In view of the conventional problems, the present disclosure has an object to provide a light emitting device which includes LED elements as light sources and discharges heat efficiently, and a lighting apparatus having the light emitting device.

A light emitting device according to an aspect of the present disclosure includes: a substrate; one or more LED (light emitting diode) elements mounted on the substrate; and a radiator unit made of metal paste arranged on a rear surface opposite to a principal surface on which the one or more LED elements are mounted, wherein, a height of the radiator unit from the rear surface is less than a thickness of the substrate.

A lighting apparatus according to the aspect of the present disclosure includes: a light emitting device according to any one of aspects of the present disclosure; a base to which the light emitting device is attached and which has a recess part in which the radiator unit is housed.

According to the present disclosure, it is possible to provide the light emitting device having LED elements as light sources and capable of discharging heat efficiently, and the lighting apparatus having the light emitting device.

BRIEF DESCRIPTION OF DRAWINGS

The figures depict one or more implementations in accordance with the present teaching, by way of examples only, not by way of limitations. In the figures, like reference numerals refer to the same or similar elements.

DESCRIPTION OF EMBODIMENTS

Hereinafter, light emitting devices and a lighting apparatus according to embodiments and variations thereof are described with reference to the drawings. It is to be noted that each of the embodiments and variations thereof described below relates to a specific example of the present disclosure. Accordingly, the numerical values, shapes, materials, constituent elements, the arrangement positions and connection states of the constituent elements, etc. illustrated in the following exemplary embodiments and variations are mere examples, and therefore do not limit the scope of the present disclosure. Therefore, among the constituent elements in the following exemplary embodiments and variations thereof, constituent elements not recited in any one of the independent claims which define the most generic concept of the present disclosure are described as arbitrary constituent elements.

It is to be noted that each of the diagrams is a schematic diagram, and is not necessarily been drawn precisely. In addition, in each of the diagrams, the same numerical references are assigned to substantially the same constituent elements, and overlapping descriptions may be omitted or simplified.

Hereinafter, the light emitting device and the lighting apparatus according to an embodiment are described. First, the light emitting device according to this embodiment is described with reference to FIGS. 1 to 5.

[Outline of Light Emitting Device]

Figure 1:
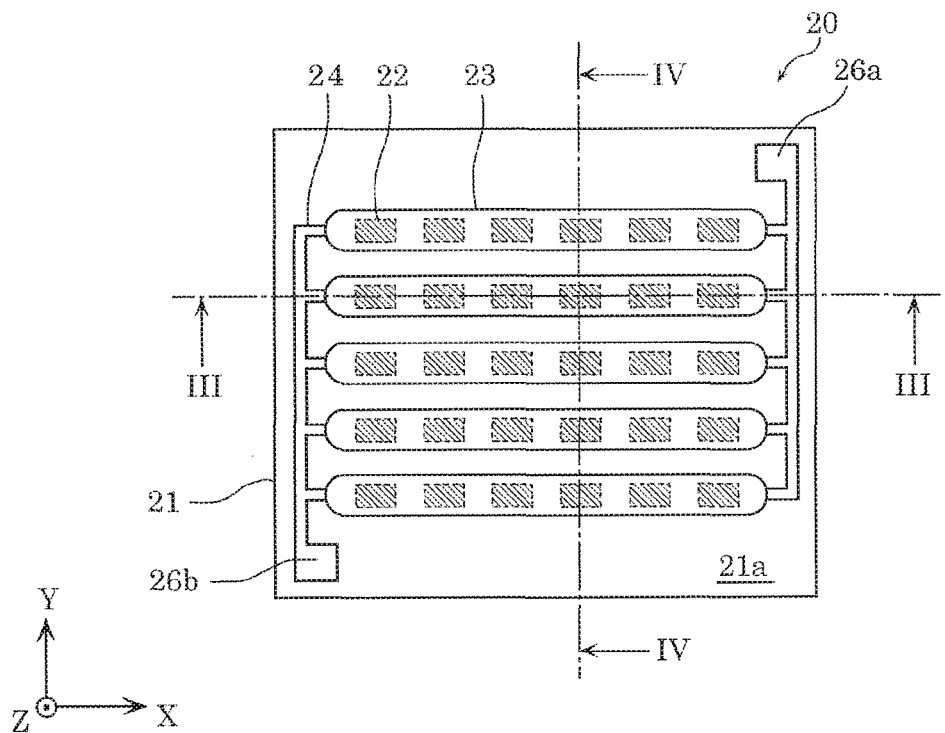
FIG. 1 is a diagram illustrating a configuration of a principal surface side of a light emitting device according to an embodiment.
Figure 2:
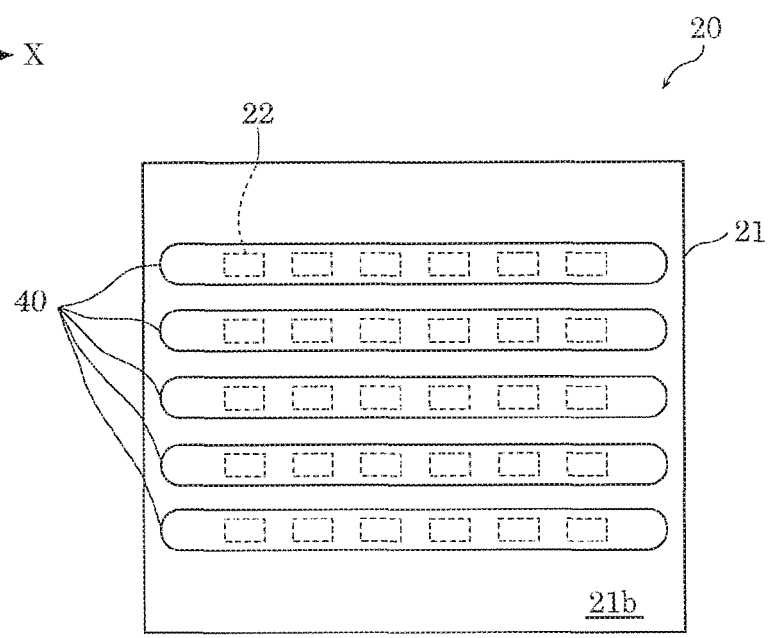
FIG. 2 is a diagram illustrating a configuration of a rear surface side of the light emitting device according to the embodiment.

FIG. 1 is a diagram illustrating a configuration of a principal surface 21a side of light emitting device 20 according to this embodiment. FIG. 2 is a diagram illustrating a configuration of a rear surface 21b side of light emitting device 20 according to this embodiment. It is to be noted that, in FIG. 2, arrangement areas of LED devices 22 are each shown using a dotted rectangle in a perspective view from rear surface 21b of substrate 21.

As illustrated in FIGS. 1 and 2, light emitting device 20 according to this embodiment includes: substrate 21; one or more LED elements 22 mounted on substrate 21; and radiator units 40 made of metal paste arranged on rear surface 21b of substrate 21. Rear surface 21b of substrate 21 is a surface opposite to principal surface 21a on which the one or more LED elements 22 are mounted.

More specifically, in this embodiment, the plurality of LED elements 22 are arranged in straight lines as five (light emitting element) lines arranged side by side on principal surface 21a of substrate 21. In each of the five lines, six LED elements 22 are arranged linearly. In addition, in each of the five light emitting element lines, six LED elements 22 are connected in series. Furthermore, the five light emitting element lines are connected in parallel by metal line 24.

In addition, terminals 26a and 26b are arranged on principal surface 21a of substrate 21. Terminals 26a and 26b are members made of the same metal material as in metal line 24, and pattern-formed at the same time when metal line 24 is formed. One of terminals 26a and 26b is connected to a positive electrode of a direct current source, and the other one of terminals 26a and 26b is connected to a negative electrode of the direct current source.

For example, blue LED chips which radiate blue light are employed as LED elements 22 included in light emitting device 20. For example, gallium-nitride-based semiconductor light emitting elements made from InGaN-based material and having a central wavelength of 440 nm to 470 nm is used as blue LED chips. In this embodiment, each of LED elements 22 is die-bonded on principle surface 21a of substrate 21 using, for example, a translucent die attach material (die bond agent). In other words, light emitting device 20 according to this embodiment has a chip on board (COB) structure.

In addition, six LED elements 22 included in each of the light emitting element lines are collectively sealed by sealing member 23 having a wavelength converting material for converting the wavelength of light.

In this embodiment, sealing member 23 is formed in phosphor-containing resin obtained by adding given phosphor particles as the wavelength converting material to a given resin. For example, a translucent material such as a silicone resin is employed as the give resin. For example, yttrium aluminum garnet (YAG)-based yellow phosphor particles are employed as the given phosphor particles.

These yellow phosphor particles emit yellow light upon being excited by blue light from LED elements 22. As a result, white light obtained from the yellow light and the blue light from LED elements 22 are emitted from light emitting device 20.

It is to be noted that the number of, arrangement positions, kinds, light colors, and electrical connection states of LED elements 22, the color(s) of light from light emitting device 20, etc. are not limited to the descriptions above. For example, the number of LED elements 22 may be one or more. The number etc. of LED elements 22 included in light emitting device 20 may be determined as necessary depending on usage etc. of light emitting device 20.

Substrate 21 is a mounting-use substrate on which one or more LED elements 22 are mounted. For example, a ceramic substrate is employed as substrate 21. An alumina substrate made of oxide aluminum (alumina), an aluminum nitride substrate made of aluminum nitride, or the like is employed as the ceramic substrate.

Specifically for example, a polycrystalline alumina substrate (polycrystalline ceramic substrate) having a thickness of approximately 1 mm obtained by baking alumina particles is employed as substrate 21.

A ceramic substrate is preferable because it has a heat conductivity higher than, for example, that of a resin-based substrate, and allows each of LED elements 22 to discharge heat efficiently. The ceramic substrate further has properties that it less deteriorates with time and has an excellent heat resistance.

It is to be noted that the kind of substrate 21 is not limited to the ceramic substrate. For example, a resin substrate, a metal-based substrate, a glass substrate made of glass, or the like is employed. In addition, for example, an aluminum alloy substrate, a ferro-alloy substrate, a copper-alloy substrate, or the like having a surface on which an insulating film is formed is employed as a metal-based substrate. In addition, for example, a glass epoxy substrate made of glass fiber and epoxy resin, or the like is employed as the resin substrate.

In light emitting device 20 having the above-described configuration, radiator units 40 are arranged on rear surface 21b of substrate 21. As illustrated in FIG. 2, radiator units 40 are arranged on areas opposing LED elements 22 on rear surface 21b of substrate 21. In this way, radiator units 40 enable efficient discharge of heat emitted from each of LED elements 22.

More specifically, LED elements 22 are arranged in lines (in this embodiment, straight lines) on principal surface 21a of substrate 21. Radiator unit 40 is arranged in a shape corresponding to the shape of a line of LED elements 22 on rear surface 21b of substrate 21. In this way, radiator unit 40 is capable of efficiently radiating heat generated in the line of LED elements 22.

In FIG. 2, five radiator units 40 are arranged on rear surface 21b of substrate 21 correspondingly to the five light emitting element lines. However, it is possible to alternatively represent that single radiator unit 40 included in light emitting device 20 is divided into parts corresponding to the five light emitting element lines.

In this embodiment, radiator units 40 arranged on rear surface 21b of substrate 21 are, as features, made of metal paste and comparatively thin. Hereinafter, the features of radiator units 40 according to this embodiment are described with reference to FIGS. 3 to 5.

[Features of Radiator Units]

Figure 3:
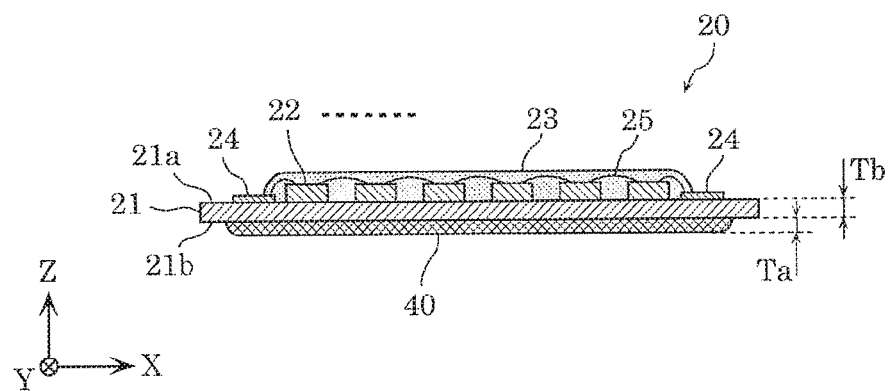
FIG. 3 is a first cross-sectional view of the light emitting device according to the embodiment.
Figure 4:
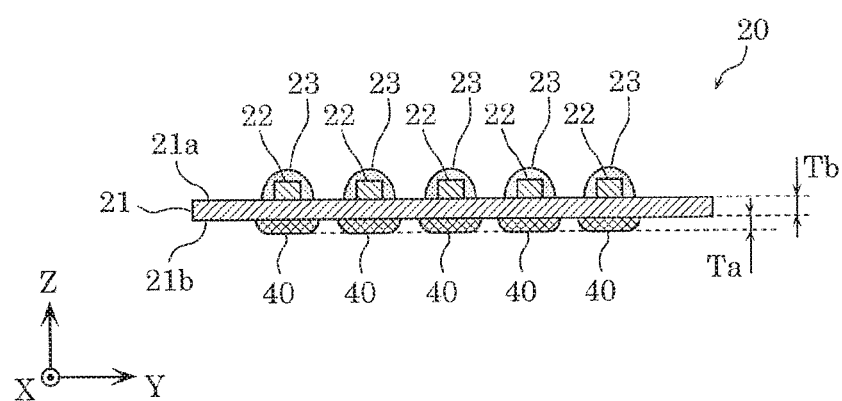
FIG. 4 is a second cross-sectional view of the light emitting device according to the embodiment.
Figure 5:
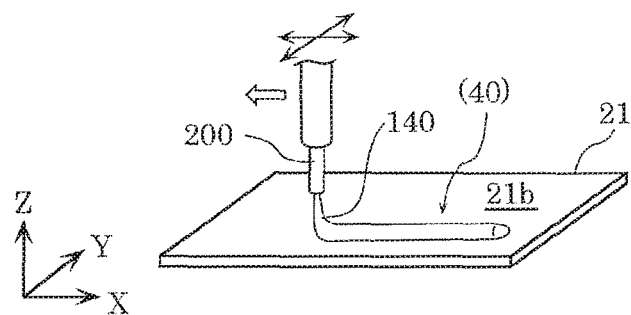
FIG. 5 is a diagram illustrating a method of forming a radiator unit according to the embodiment.

FIG. 3 is a first cross-sectional view of light emitting device 20 according to this embodiment, and FIG. 4 is a second cross-sectional view of light emitting device 20 according to this embodiment. More specifically, FIG. 3 is a diagram illustrating a schematic cross-sectional view along line III-III in FIG. 1, and FIG. 4 is a diagram illustrating a schematic cross-sectional view along line IV-IV in FIG. 1. FIG. 5 is a diagram illustrating a method of forming radiator unit 40 according to this embodiment.

As illustrated in FIGS. 3 and 4, in this embodiment, radiator units 40 are arranged in areas including locations immediately below the light emitting element lines of six LED elements 22. More specifically, radiator units 40 are arranged at positions opposing areas including six LED elements 22 and metal line 24 and so on connected to six LED elements 22, on rear surface 21b of substrate 21.

As illustrated in FIG. 3, six LED elements 22 are connected in series by wire 25, and both-end LED elements 22 among six LED elements 22 are connected to metal line 24 by wire 25. As illustrated in FIG. 1, terminals 26a and 26b are connected to metal line 24, and each of LED elements 22 emits light upon receiving electricity through terminals 26a and 26b.

By providing radiator units 40 in the areas including locations immediately below LED elements 22, metal line 24, and wire 25 connected as described above, it is possible to efficiently discharge heat generated from conductive members (LED elements 22, metal line 24, and wire 25).

This embodiment employs a structure in which each of LED elements 22 adjacent to any other one of LED elements 22 are directly connected by wire 25. With this, for example, it is possible to increase the number of LED elements 22 per unit area. In an exemplary case where the distance between adjacent LED elements 22 needs to be comparatively made longer, LED elements 22 may be electrically connected via metal line 24 called a land.

Here, since radiator units 40 are made of metal paste, the arrangement position, size, or shape of each radiator unit 40 is highly flexible. Stated differently, it is possible to form radiator units 40 to have an appropriate size and shape at an appropriate position, according to the arrangement positions (layout) of LED elements 22 on principal surface 21a of substrate 21. Furthermore, the thickness of each radiator unit 40 is also easy to control.

Specifically, in this embodiment, as illustrated in FIGS. 3 and 4, height Ta of radiator unit 40 from rear surface 21b of substrate 21 is less than thickness Tb of substrate 21. Simply speaking, radiator unit 40 is formed to be thinner than substrate 21. For example, when thickness Tb of substrate 21 is 1 mm, height (thickness) Ta from rear surface 21b of radiator unit 40 is no more than 1 mm.

Stated differently, radiator unit 40 is made of metal paste and thus contains metal components, which secures efficacy of heat discharge. Furthermore, since radiator unit 40 is made of metal paste which allows easy control of an application amount and an application position in manufacturing, it is possible to form radiator unit 40 to have an arbitrary shape at an arbitrary position and to be thin. These features are advantageous for increasing heat discharge efficiency in light emitting device 20 and making light emitting device 20 compact.

As for increase in heat discharge efficiency in light emitting device 20, light emitting device 20 according to this embodiment may be implemented as, for example, light emitting device 20 which provides a comparatively large output of light, in order to increase bundles of light from light emitting device 20.

Radiator 40 having the above features is formed using the following method, for example. As illustrated in FIG. 5, by discharging metal paste 140 from nozzle 200 which is movable along a plane (XY plane in FIG. 5) parallel to rear surface 21b of substrate 21, it is possible to form radiator unit 40 having a given size and shape at an arbitrary position on rear surface 21b of substrate 21.

For example, control is performed on the amount of discharge of metal paste 140 from nozzle 200 per unit time, a moving speed of nozzle 200, timing for discharging metal paste 140 from nozzle 200, etc. In this way, it is possible to form, on rear surface 21b of substrate 21, radiator unit 40 having an appropriate size (including a thickness) at an appropriate position on an area for mounting LED elements 22 on principal surface 21a (the area for mounting means an area on which LED elements 22 are to be mounted, or an area on which LED elements 22 have already been mounted).

In addition, for example, it is also possible to use tools including nozzle 200 for forming radiator unit 40, also as tools for forming sealing member 23. In other words, it is possible to arrange radiator unit 40 made of metal paste 140 on substrate 21, using tools for forming sealing member 23.

Metal paste 140 applied to rear surface 21b of substrate 21 is cured by being heated in, for example, a curing oven, to form radiator unit 40 made of metal paste 140.

In addition, for example, after process of forming radiator unit 40 onto rear surface 21b of substrate 21 (the process includes applying, curing, etc. of metal paste 140), a process of mounting one or more LED elements 22 onto principal surface 21a of substrate 21 is performed. It should be noted that a procedure for manufacturing light emitting device 20 is not limited to the above procedure. Alternatively, after one or more LED elements 22 are mounted on principal surface 21a of substrate 21, radiator unit 40 may be formed on rear surface 21b of substrate 21.

One example shown here as metal paste 140 which is a material for radiator unit 40 is metal paste 140 which contains copper as a metal component and contains a glass component as a binder. Since copper has a high heat conductivity, by forming radiator unit 40 using metal paste 140 containing copper as a metal material, it is possible to increase a heat discharge efficiency by radiator unit 40.

Furthermore, the glass component contained in metal paste 140 increases adherence with substrate 21, which secures reliability in adherence (fixation) between radiator unit 40 and substrate 21.

As described above, light emitting device 20 according to this embodiment includes: radiator unit 40 made of metal paste 140 arranged on rear surface 21b of substrate 21. Rear surface 21b is opposite to principal surface 21a on which one or more LED elements 22 are mounted. Furthermore, height Ta of radiator unit 40 from rear surface 21b is less than thickness Tb of substrate 21.

With this configuration, since the position, size, or shape of radiator unit 40 is highly flexible, it is possible to form radiator unit 40 according to the number, positions, etc. of LED elements 22 mounted on principal surface 21a of substrate 21. As a result, it is possible to obtain high heat discharge effect by radiator unit 40. In addition, since radiator unit 40 is formed to be comparatively thin, for example, it is possible to make light emitting device 20 compact.

It is to be noted that the configuration and shape of radiator unit 40 included in light emitting device 20 may be a configuration and a shape other than the above-described ones. In view of this, various kinds of variations of radiator unit 40 are described below mainly focusing on differences from radiator 40 in the above embodiment.

[Variation 1]

Figure 6:
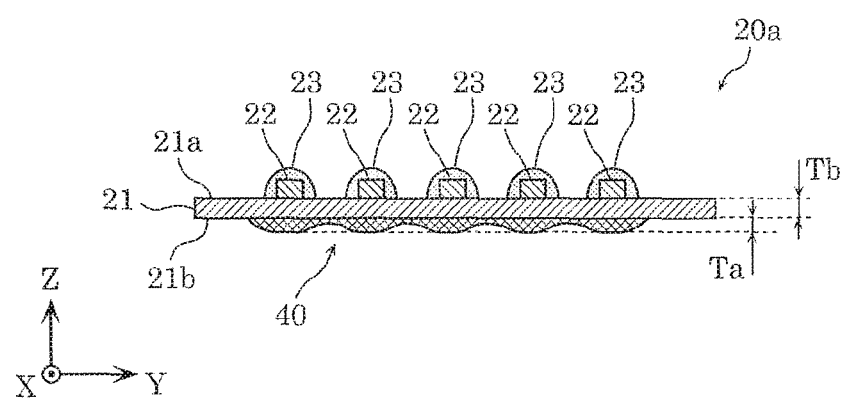
FIG. 6 is a cross-sectional view of a light emitting device according to Variation 1 of the embodiment.

FIG. 6 is a schematic cross-sectional view of light emitting device 20a according to Variation 1 of the embodiment. FIG. 6 illustrates a cross section along a line corresponding to IV-IV line in FIG. 1.

As illustrated in FIG. 6, light emitting device. 20a according to this variation includes radiator unit 40 formed continuously in a direction (Y-axis direction) of light emitting element lines on rear surface 21b of substrate 21. More specifically, in light emitting device 20 in the above embodiment, five radiator units 40 separated from each other are provided on substrate 21 correspondingly to five light emitting element lines (refer to FIGS. 1 and 4). In comparison, in light emitting device 20a illustrated in FIG. 6 according to this variation, continuous radiator unit 40 is formed on rear surface 21b of substrate 21 such that continuous radiator unit 40 opposes co-located light emitting elements between five light emitting element lines.

In addition, radiator unit 40 according to this variation is thicker at the position opposing each of five LED elements 22 arranged in the Y-axis direction than at the other position. In other words, height Ta of radiator unit 40 at the position opposing each of LED elements 22 is more than the height at the other position.

In other words, in this variation, radiator unit 40 is formed such that it has parts opposing to intervals between adjacent LED elements 22 on principal surface 21a, and has a thickness (height from rear surface 21b) of the parts that is less than the thickness of the parts opposing adjacent LED elements 22. In this way, for example, it is possible to increase heat discharge effect by radiator unit 40, and reduce increase in the amount of metal paste 140 used for radiator unit 40.

There is no particular limitation on a procedure for forming radiator unit 40 having a cross sectional shape illustrated in FIG. 6. For example, radiator unit 40 is formed using the following procedure. Metal paste 140 is applied to the position opposing each of five LED elements 22 on rear surface 21b of substrate 21 on as to form five lines of metal paste 140. After each of lines drips for example due to gravity, and as a result, spaces between the lines are filled with metal paste 140 and integrated with the lines, and integrated metal paste 140 corresponding to the lines is cured.

Alternatively, for example, it is possible to form radiator unit 40 having a cross sectional shape as illustrated in FIG. 6, by applying a small amount of metal paste 140 in the shape of lines between adjacent lines among the five lines of metal paste 140 formed as described above, and curing metal paste 140.

Radiator unit 40 according to this variation does not have to be extended in a direction (X-axis direction) perpendicular to the paper sheet of FIG. 6. For example, when five LED elements 22 arranged in the Y-axis direction is regarded as a set, mutually separate radiators 40 each having the cross sectional shape as illustrated in FIG. 6 may be arranged for each set of LED elements 22.

[Variation 2]

Figure 7:
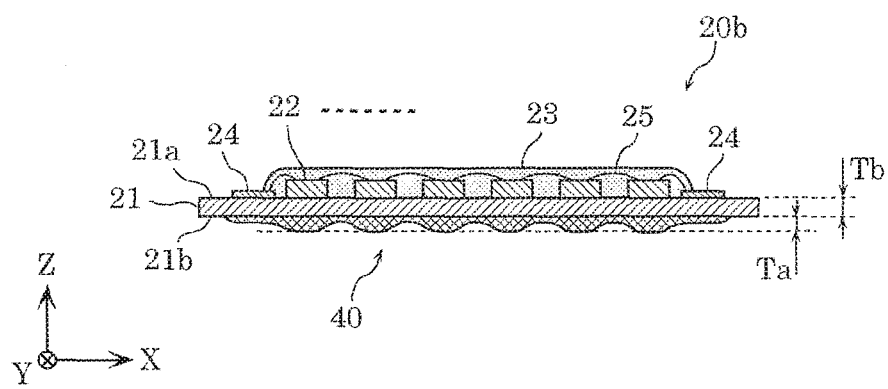
FIG. 7 is a cross-sectional view of a light emitting device according to Variation 2 of the embodiment.

FIG. 7 is a cross-sectional view of light emitting device 20b according to Variation 2 of the embodiment. FIG. 7 illustrates a cross section along a line corresponding to line III-III in FIG. 1.

As illustrated in FIG. 7, emitting device 20b according to this variation includes radiator unit 40 disposed correspondingly to a light emitting element line made up of six LED elements 22 collectively sealed by sealing member 23. This point is the same as in the above embodiment.

Light emitting device 20b according to this variation is thicker at the position opposing each of LED elements 22 included in the light emitting element line than at the other position. This is a difference from light emitting device 20 according to the above embodiment.

Similar to Variation 1, in this variation, height Ta of radiator unit 40 at the position opposing each of LED elements 22 is more than the height at the other position, and is less than thickness Tb of substrate 21. In this way, for example, it is possible to reduce the amount of metal paste 140 used for radiator unit 40, and secure effects of heat discharge by radiator unit 40.

There is no particular limitation on a procedure for forming radiator unit 40 having a cross sectional shape illustrated in FIG. 7. For example, radiation unit 40 is formed using the following procedure. When meal paste 140 is applied using nozzle 200 (refer to FIG. 5), the amount of application to the position opposing each of LED elements 22 on rear surface 21b of substrate 21 is increased. By doing so, a line of metal paste 140 having uneven thicknesses as illustrated in FIG. 7 is formed, and then metal paste 140 is cured to form radiator unit 40.

For example, when meal paste 140 is applied using nozzle 200, the moving speed of nozzle 200 when passing through the position opposing each of LED elements 22 on rear surface 21b of substrate 21 is reduced. By doing so, the line of metal paste 140 having uneven thicknesses as illustrated in FIG. 7 are formed, and then metal paste 140 is cured. Radiator unit 40 having the cross sectional shape illustrated in FIG. 7, may be formed according to any of these procedures.

[Variation 3]

Figure 8:
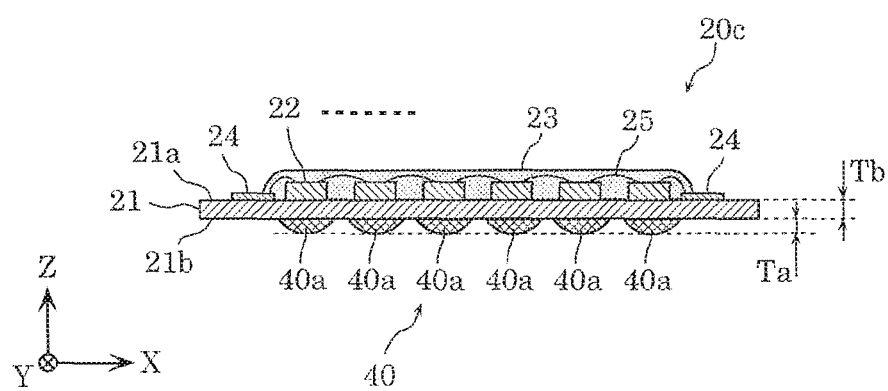
FIG. 8 is a cross-sectional view of a light emitting device according to Variation 3 of the embodiment.
Figure 9:
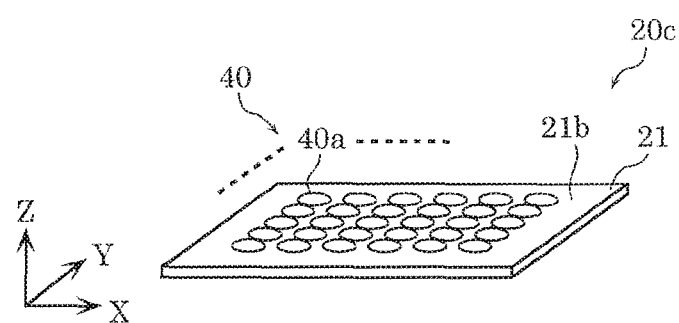
FIG. 9 is a perspective view of the appearance of a radiator unit according to Variation 4 of the embodiment.

FIG. 8 is a cross-sectional view of light emitting device 20c according to Variation 3 of the embodiment. FIG. 8 illustrates a cross section of a part corresponding to a cross section along a line corresponding to line III-III in FIG. 1. FIG. 9 is a perspective view of the appearance of radiator unit 40 according to Variation 3 of the embodiment.

As illustrated in FIGS. 8 and 9, light emitting device 20c according to this variation includes partial radiator units 40a at the position opposing each of LED elements 22 arranged on principal surface 21a of substrate 21. These partial radiator units 40a make up single radiator unit 40. In other words, in this variation, LED elements 22 and partial radiator units 40a are in a one-to-one correspondence. Furthermore, height Ta of each partial radiator unit 40a from rear surface 21b is less than thickness Tb of substrate 21.

In this way, radiator unit 40 according to this variation includes partial radiator units 40a discretely arranged on rear surface 21b of substrate 21 such that each of partial radiator units 40a opposes a different one of LED elements 22.

By forming radiator unit 40 which is a group of partial radiator units 40a having a small volume and arranged at the position opposing each of LED elements 22 in this way, for example, it is possible to reduce the amount of metal paste 140 used for radiator unit 40 while securing effects of heat discharge by radiator unit 40.

[Variation 4]

Figure 10:
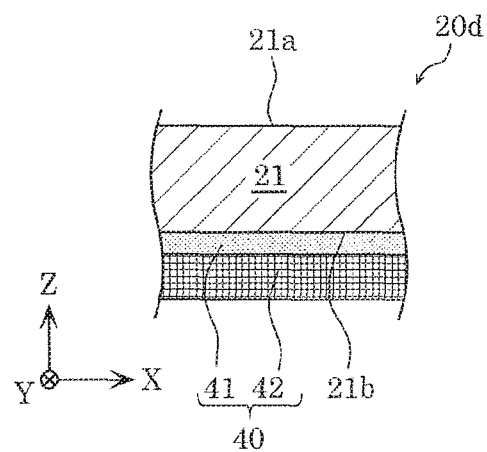
FIG. 10 is a cross-sectional view of the radiator unit according to Variation 4 of the embodiment.

FIG. 10 is a cross-sectional view of radiator unit 40 according to Variation 4 of the embodiment. More specifically, light emitting device 20d according to this variation includes radiator unit 40 disposed on rear surface 21b of substrate 21 and formed of layers having different properties.

More specifically, radiator unit 40 according to this variation includes first layer 41 which is in contact with rear surface 21b of substrate 21 and second layer 42 stacked on first layer 41. Metal paste 140 forming first layer 41 having a binder percentage content (for example, a mass weight of the binder per unit volume) is larger than a binder percentage content in metal paste 140 forming second layer 42.

In this way, for example, it is possible to increase or improve adhesivity to rear surface 21b of substrate 21 while securing effects of heat discharge by radiator unit 40. More specifically, as described above, when metal paste 140 includes a binder containing a glass component, an increase in the amount of the binder in first layer 41 results in an increase in the amount of the glass component in first layer 41. As a result, reliability of adhesivity between radiator unit 40 and rear surface 21b of substrate 21 is secured. In addition, in second layer 42, a decrease in the binder percentage content, stated differently, an increase in a metal component (such as copper) secures heat discharge by radiator unit 40.

Although not illustrated in FIG. 10, it is to be noted that the relationship between height Ta of radiator unit 40 according to this variation and thickness Tb of substrate 21 is expressed by Ta<Tb. This is the same as in the above-described embodiment and Variations 1 to 3. Radiator unit 40 according to this variation may be arranged for any of light emitting devices (20, 20a to 20c) according to the above-described embodiment and Variations 1 to 3.

There is no particular limitation on a procedure for forming radiator unit 40 having a configuration illustrated in FIG. 10. For example, radiator unit 40 is formed using the following procedure. Metal paste 140 having a composition in which the amounts of components are adjusted to form first layer 41 is discharged from nozzle 200. On metal paste 140 for first layer 41, metal paste 140 having a composition in which the amounts of components are adjusted to form second layer 42 is discharged from nozzle 200. Subsequently, metal paste 140 obtained by applying the two layers of different compositions in a superimposed manner is cured. Radiator unit 40 having the configuration illustrated in FIG. 10 may be formed according to any of these procedures.

In addition, first layer 41 and second layer 42 may be made from metal paste 140 having different components. For example, in order to prevent an additive included in second layer 42 from soaking into substrate 21, a component for preventing the additive from soaking may be included in first layer 41.

[Variation 5]

Figure 11:
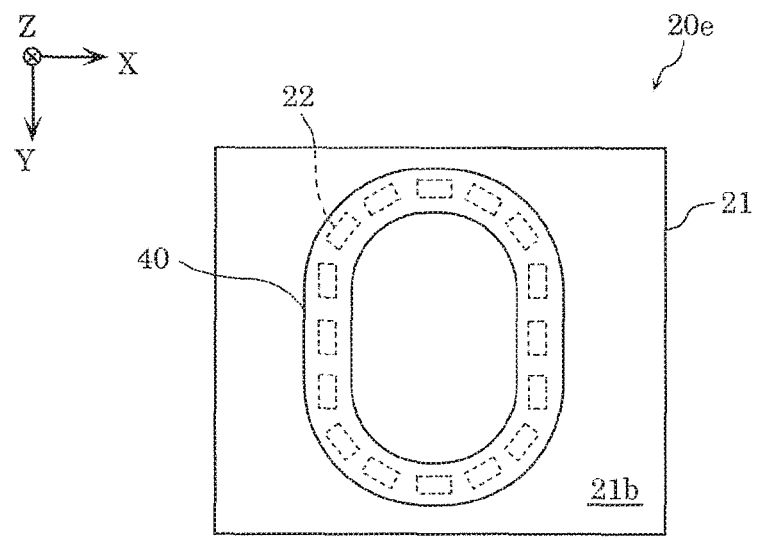
FIG. 11 is a diagram illustrating a plan-view shape of a radiator unit according to Variation 5 of the embodiment.

FIG. 11 is a diagram illustrating a plan-view shape of radiator unit 40 according to Variation 5 of the embodiment. Specifically, light emitting device 20e according to this variation includes circular radiator unit 40. In other words, radiator unit 40 according to this variation has a shape including a curved part in the plan view.

Since radiator unit 40 is formed by metal paste 140 as described above, the position, size, or shape are highly flexible. In view of this, even when the shapes of lines of LED elements 22 have curved lines or are circular on principal 21a of substrate 21, it is possible to arrange radiator unit 40 in a shape corresponding to the shape of the lines of LED elements 22 on rear surface 21b of substrate 21.

For example, in the plan view, even when LED elements 22 are arranged in the shape of Z, it is possible to form radiator unit 40 along the shape (the shape of Z).

For example, even when LED elements 22 are arranged in a complicated layout on principal surface 21a of substrate 21, it is possible to form radiator unit 40 continuously or discretely such that positions of opposing LED elements 22 are connected on rear surface 21b of substrate 21.

In this way, it is possible to efficiently discharge heat of LED elements 22 arranged in the complicated layout.

Light emitting device 20 according to the embodiment and light emitting device 20a to 20e according to Variations 1 to 5 have been described above. These light emitting devices 20 etc. are, for example, attached to lighting apparatuses and used as light sources for lighting. In view of this, as an example of a lighting apparatus according to the embodiment, a lighting apparatus including light emitting device 20 as a light source for lighting is described with reference to FIG. 12.

(Lighting Apparatus)

Figure 12:
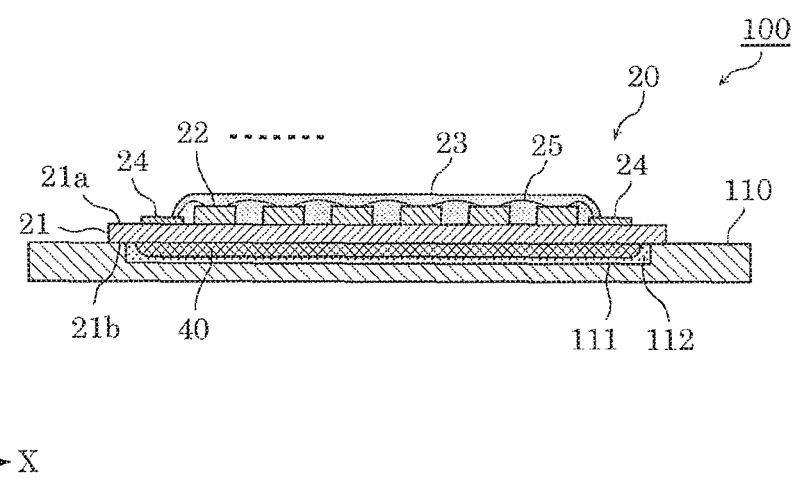
FIG. 12 is a diagram illustrating a schematic configuration of a lighting apparatus according to the embodiment.

FIG. 12 is a diagram illustrating a schematic configuration of lighting apparatus 100 according to the embodiment. In order to clarify features of lighting apparatus 100, FIG. 12 is provided to illustrate a cross section (along a line corresponding to line III-III in FIG. 1) of lighting apparatus 100.

Lighting apparatus 100 illustrated in FIG. 12 includes: light emitting device 20; and base 110 to which light emitting device 20 is attached, base 110 having recess part 111 in which radiator unit 40 is housed Base 110 is made of aluminum, an aluminum alloy, or the like, and allows efficient discharge of heat transferred from light emitting device 20. In addition, since base 110 is formed to have recess part 111, base 110 can house, in recess part 111, radiator unit 40 which is a protruding part at the rear side (the side of rear surface 21b of substrate 21) of light emitting device 20. As a result, for example, stability of fixation of light emitting device 20 onto base 110 is increased.

In addition, for example, as illustrated in FIG. 12, light emitting device 20 may be attached to base 110 after grease 112 is applied to the inside of recess part 111 which has been formed to have rectangular cross sections. In this way, at least part of space between radiator unit 40 and base 110 is filled with a material, having a heat conductivity higher than that of air. For this reason, heat discharge of light emitting device 20 via base 110 is further accelerated.

Furthermore, radiator unit 40 of light emitting device 20 is made comparatively thin as described above, and thus it is possible to configure base 110 having recess part 111 to be thin. In this way, for example, it is also possible to make lighting apparatus 100 compact.

Light emitting device 20 is attached to base 110 by, for example, being fixed using screws or being supported by one or more members fixed on base 110.

In addition, lighting apparatus 100 may include one or more members such as a driver circuit which supplies light emitting device 20 with power required for light emission and a translucent cover which covers the principle surface 21a side of light emitting device 20.

In addition, lighting apparatus 100 may include any one of light emitting devices 20a to 20e according to Variations 1 to 5, as a replacement for light emitting device 20. Applications of lighting apparatus 100 are not particularly limited. For example, lighting apparatus 100 may be used as an apparatus which is disposed on the ceiling of a room and illuminates the inside of the room.

Other Embodiments

Although the light emitting device and the lighting apparatus according to the present disclosure have been described above based on the embodiment and Variations thereof, the present disclosure is not limited to the embodiment etc.

For example, although light emitting device 20 according to the embodiment emits white light using, in combination, LED elements 22 which are blue LED chips and yellow phosphors, the configuration for emitting white light is not limited thereto.

For example, phosphor-containing resin containing red phosphors and green phosphors may be combined with the blue LED chips. Alternatively, violet LED chips which emit violet light having a wavelength shorter than that of blue LED chips may be combined with blue phosphor particles, green phosphor particles, and red phosphor particles which emit blue light, green light, and red light, respectively, upon being excited mainly by ultraviolet rays.

In addition, LED elements 22 do not have to be LED chips themselves. LED elements 22 may be, for example, LED elements which are surface mount devices (SMDs) having packages each having an opening in its upper surface and LED chips arranged in the package.

In addition, the shape, size, etc. of substrate 21 are not limited. For example, when light emitting device 20 is provided as an LED module to an LED lamp having a straight tube shape, light emitting device 20 may include long substrate 21. In addition, in an exemplary case where light emitting device 20 is provided, as an LED module to an LED lamp having a bulb shape, light emitting device 20 may include substrate 21 having a ring shape. In any case, it is only necessary that light emitting device 20 include radiator unit 40 made of metal paste on rear surface 21b of substrate 21, and radiator unit 40 be thinner than substrate 21. In this way, it is possible to efficiently discharge heat of one or more LED elements 22 mounted on substrate 21. Furthermore, it is possible to make substrate 21 compact.

Those skilled in the art will readily appreciate that many modifications are possible in the exemplary embodiment and variations thereof and that other embodiments are obtainable, by arbitrarily combining the constituent elements of the embodiments without materially departing from the scope of the present disclosure. Accordingly, all of the modifications and other embodiments are intended to be included within the scope of the present disclosure.

While the foregoing has described what are considered to be the best mode and/or other examples, it is understood that various modifications may be made therein and that the subject matter disclosed herein may be implemented in various forms and examples, and that they may be applied, in numerous applications, only some of which have been described herein. It is intended by the following claims to claim any and all modifications and variations that fall within the true scope of the present teachings.

The invention claimed is:

1. A light emitting device comprising:
a substrate;
one or more light emitting diode (LED) elements mounted on the substrate; and
a radiator unit comprising a metal paste arranged on a rear surface of the substrate opposite to a principal surface of the substrate on which the one or more LED elements are mounted,
wherein, a height of the radiator unit from the rear surface is less than a thickness of the substrate,
wherein the radiator unit includes a first layer which is in contact with the rear surface, and a second layer which is stacked on the first layer, and
the metal paste of the first layer has a binder percentage content that is larger than a binder percentage content in the metal paste forming the second layer.

2. The light emitting device according to claim 1,
wherein the one or more LED elements mounted on the principal surface comprise a plurality of LED elements, and
the radiator unit is arranged in an area of the rear surface, the area opposing the plurality of LED elements.

3. The light emitting device according to claim 2,
wherein a height of the radiator unit at a position opposing each of the plurality of LED elements is greater than a height of the radiator unit at another position that does not oppose each of the plurality of LED elements.

4. The light emitting device according to claim 2,
wherein, the radiator unit includes a plurality of partial radiator units arranged discretely on the rear surface, each of the plurality of partial radiator units being arranged at a position opposing a different one of the plurality of LED elements.

5. The light emitting device according to claim 2,
wherein the plurality of LED elements are arranged in a line on the principal surface, and
the radiator unit is arranged in a shape corresponding to a shape of the line on the rear surface.

6. The light emitting device according to claim 1,
wherein the metal paste contains copper as a metal component.

7. A lighting apparatus comprising:
a light emitting device according to claim 1; and
a base to which the light emitting device is attached, the base having a recess part in which the radiator unit is housed.

* * * * *